United States Patent
Huang et al.

(10) Patent No.: US 8,486,803 B2
(45) Date of Patent: Jul. 16, 2013

(54) WAFER LEVEL PACKAGING METHOD OF ENCAPSULATING THE BOTTOM AND SIDE OF A SEMICONDUCTOR CHIP

(75) Inventors: Ping Huang, Songjiang (CN); Ruisheng Wu, Songjiang (CN); Lei Duan, Songjiang (CN); Yi Chen, Songjiang (CN); Yuping Gong, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 33 days.

(21) Appl. No.: 13/273,168

(22) Filed: Oct. 13, 2011

(65) Prior Publication Data
US 2013/0095612 A1 Apr. 18, 2013

(51) Int. Cl.
*H01L 21/30* (2006.01)
(52) U.S. Cl.
USPC ............................ 438/458; 257/E21.599
(58) Field of Classification Search
USPC ............... 438/110, 113, 114, 458, 459, 460, 438/464; 257/E21.599
See application file for complete search history.

(56) References Cited

U.S. PATENT DOCUMENTS 7,498,196 B2 * 3/2009 Lee et al. .................... 438/108

* cited by examiner

*Primary Examiner* — Quoc Hoang
(74) *Attorney, Agent, or Firm* — Chein-Hwa Tsao; CH Emily LLC

(57) ABSTRACT

A chip-scale packaging method, with bottom and side of a semiconductor chip encapsulated, includes the following steps: attaching backside of a thinned semiconductor wafer to a dicing tape; separating individual chips by cutting from front side of the wafer at scribe line but not cut through the dicing tape; flipping and attaching the wafer onto a top surface of a double-sided tape, then removing the dicing tape; attaching bottom surface of the double-sided tape on a supporting plate; filling the space between adjacent chips and covering the whole wafer backside with a molding material; flipping the whole structure and remove the supporting plate; placing solder balls at corresponding positions on electrodes of each chip and performing backflow treatment; finally separating individual chip packages by cutting through molding material at the space between adjacent chip packages with molding material encapsulating the bottom and side of each individual semiconductor chip.

7 Claims, 5 Drawing Sheets

WAFER LEVEL PACKAGING METHOD OF ENCAPSULATING THE BOTTOM AND SIDE OF A SEMICONDUCTOR CHIP

FIELD OF THE INVENTION

This invention relates to a wafer level packaging (WLP) method, and particularly relates to a WLP with the side and bottom of a semiconductor chip encapsulated by a molding compound.

BACKGROUND OF THE INVENTION

In the advanced chip packaging methods, the WLP technique is a technique in which packaging and tests are performed on a semiconductor wafer and then the wafer is molded and singulated into individual IC packages.

FIG. 1 is a cross sectional diagram of a conventional semiconductor chip package. As shown in FIG. 1, the semiconductor chip package 200 includes package body 300 surrounding the semiconductor chip 100. In addition, the semiconductor chip package 200 includes metal contact pad 210 and passivation layer 220 formed on the top surface of the semiconductor chip 100, and the solder ball 230 formed on the top electrode of the semiconductor chip 100. A packaging method of forming the semiconductor chip package 200 is shown in FIG. 2. In step A1, a semiconductor wafer including a plurality semiconductor chips 100 are mounted onto a tape 400 with metal contact pad 210, passivation layer 220 and solder ball 230 formed on a front side of the chip 100. In step A2, the individual semiconductor chips 100 are separated by cutting through track 110 between two adjacent semiconductor chips 100, but the chips 100 still remain attached to tape 400. In step A3, plastic resin or other molding compound is filled into the dicing track 110 to form the plastic body 300. In step A4, individual semiconductor chip package 200 is separated from each other by sawing through a portion of the package body 300, thus the tape 400 is removed. However, the bottom of the semiconductor chip 100 of the chip package 200 is not encapsulated with plastic body 300, thus the semiconductor chip 100 is not completely protected.

FIG. 3 is a cross sectional diagram of another conventional semiconductor chip package 200. As shown in FIG. 3, the bottom and side of the semiconductor chip 100 are encapsulated with the plastic body 300. A packaging method for forming the chip package 200 of FIG. 3 is shown in FIG. 4. In Step B1 and B2, semiconductor chips 100 firstly attached on a tape 400 with the front side of each chip 100 facing downward, with a certain space between two adjacent chips 100. In step B3, a plastic material is deposited to fill into the space between adjacent chips 100 and to cover the back side of the semiconductor chip 100, which forms the plastic body 300. In step B4 and B5, the tape 400 is removed, then the whole structure, which include semiconductor chips 100 encapsulated by the plastic package body 300, is flipped. In step B6 and B7, fan-out RDL (Redistribution Layer) technique is applied to redistribute the electrode pads with metal contact pad 210 and passivation 220 formed on the front side of semiconductor chip 100. In step B8 and B9, solder balls 230 are placed on the front side of semiconductor chip 100 to form top electrode of chip package 200. After the chip package 200 is tested, individual chip packages 200 of the type shown in FIG. 3 are singulated. This semiconductor chip package 200 has plastic package protection on its side and bottom. However, the production process is very complicated.

SUMMARY OF THE INVENTION

This invention aims to provide a wafer level packaging method to obtain a semiconductor chip package structure, in which the semiconductor chip is encapsulated at its bottom and side with a molding compound.

The method of the present invention includes the following steps:

preparing a plurality of semiconductor chips at a front side of a semiconductor wafer and setting surface patterns for a plurality chip packages, each of chip package correspondingly on a front side of a semiconductor chip with the front side of the semiconductor chip facing up;

grinding at a backside of the semiconductor chip to reduce a thickness of the semiconductor chip;

connecting the backside of the semiconductor chip onto a dicing film;

cutting from the front side of the semiconductor chips to separate the semiconductor chip packages that are still connected to each other through the dicing film at the backside, with the relative position and space between adjacent semiconductor chips remained unchanged;

flipping and attaching the semiconductor chips with the dicing film on a top surface of a double-sided tape, removing the dicing film; and attaching a bottom surface of the double-sided tape on a supporting substrate;

depositing a molding compound to cover the back side of the semiconductor chip and to fill in the space between adjacent semiconductor chip packages;

flipping the semiconductor chip packages, and removing the supporting substrate and the double-sided tape from the semiconductor chip packages;

depositing and reflow solder balls on the front side of the semiconductor chip at positions corresponding to top electrodes of each semiconductor chip package; and cutting through the plastic package in the space between adjacent chip packages to separate individual chip packages, the bottom and side of each are covered with the plastic package for protection.

In one embodiment, when the semiconductor chip is a metal oxide semiconductor field effect transistor (MOSFET), the front side of the semiconductor chip includes an initial layer of silicon dioxide, metal contact pads of aluminum and a passivation layer. The thickness of the semiconductor chip is reduced by grinding from its backside, then a metal layer of a certain thickness is deposited on the backside of the thinned semiconductor chip. In another embodiment, when the semiconductor chip package is a power device, the re-distribution of the metal contact pad is performed on the front side of the semiconductor chip, as such the front side of the semiconductor chip includes the initial layer of silicon dioxide, re-distributed metal contact pad of aluminum, and a passivation layer.

The double-sided tape has good ductility, such that, after the whole semiconductor chip is flipped and attached on top surface of the double-sided tape, it can stretch to enlarge the space between the adjacent chip packages for the deposition of the molding compound into this space. The bottom surface of the double sided tape is attached on the supporting substrate to maintain the space between the adjacent chip packages. The dicing film can be a UV tape. The double-sided tape can be a thermal release tape or UV release tape. The supporting substrate can be a glass substrate or other semiconductor substrates.

Compared with the existing technologies, the wafer level packaging method in this invention provides a chip package structure with the side and bottom of the semiconductor chip encapsulated by a molding compound through a simple and feasible production process.

DETAILED DESCRIPTION OF THE EMBODIMENTS

A number of embodiments of this invention will be described as follows with illustration drawings.

The wafer level packaging method in this invention is especially suitable for the encapsulating of MOSFET or other similar semiconductor chips, so that the bottom and side of each semiconductor chip are protected with a molding compound.

Figure 1:
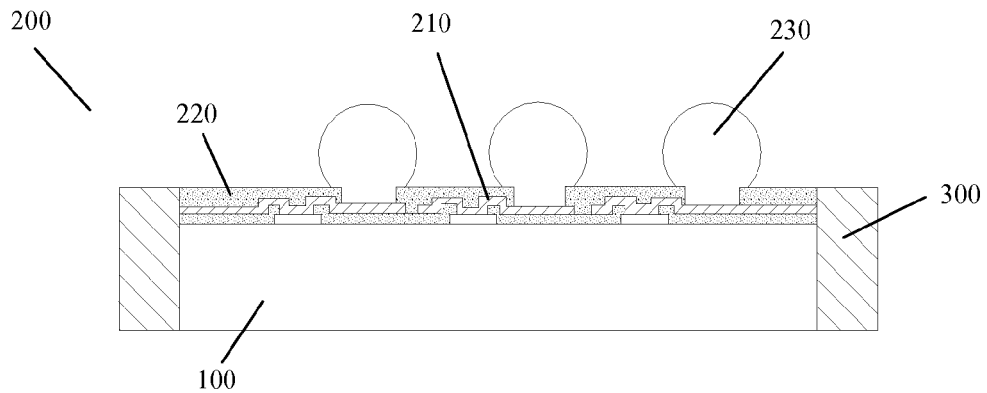
FIG. 1 is the structure diagram of an existing semiconductor chip package having plastic package encapsulating its side.
Figure 2:
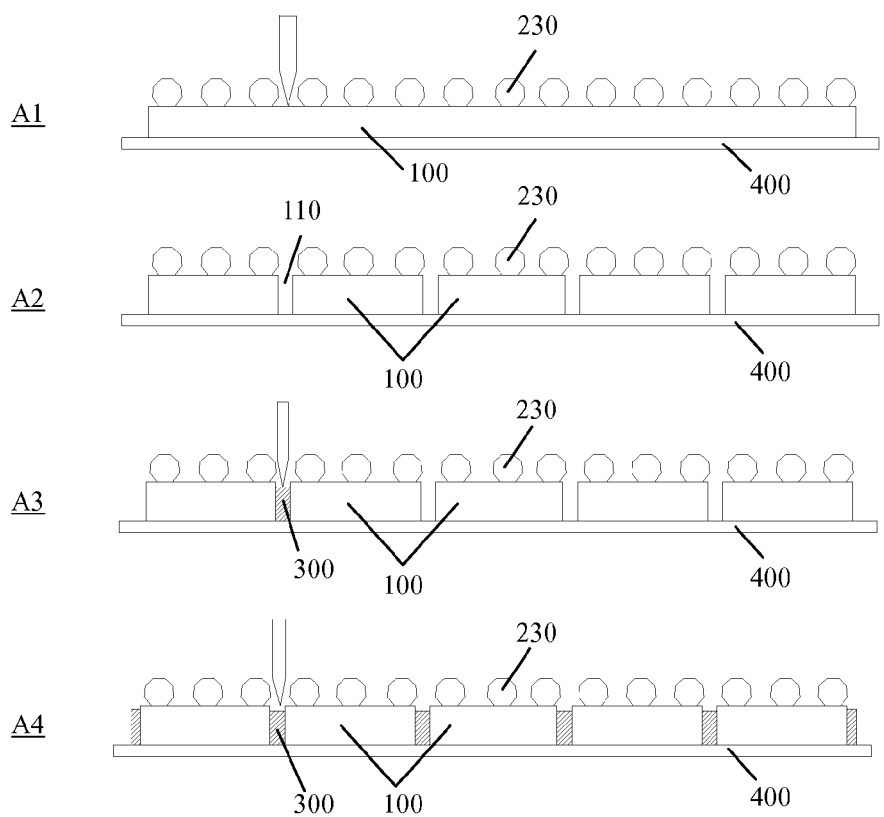
FIG. 2 is schematic diagram of production process of the semiconductor chip package as shown in FIG. 1.
Figure 3:
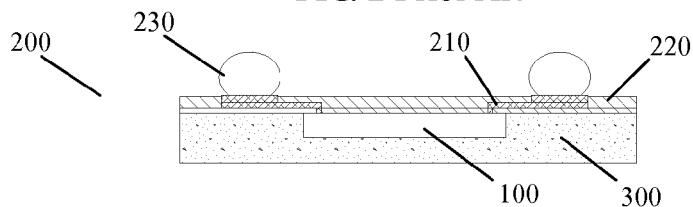
FIG. 3 is the structure diagram of another existing semiconductor chip package having plastic package encapsulating both of its bottom and side.
Figure 4:
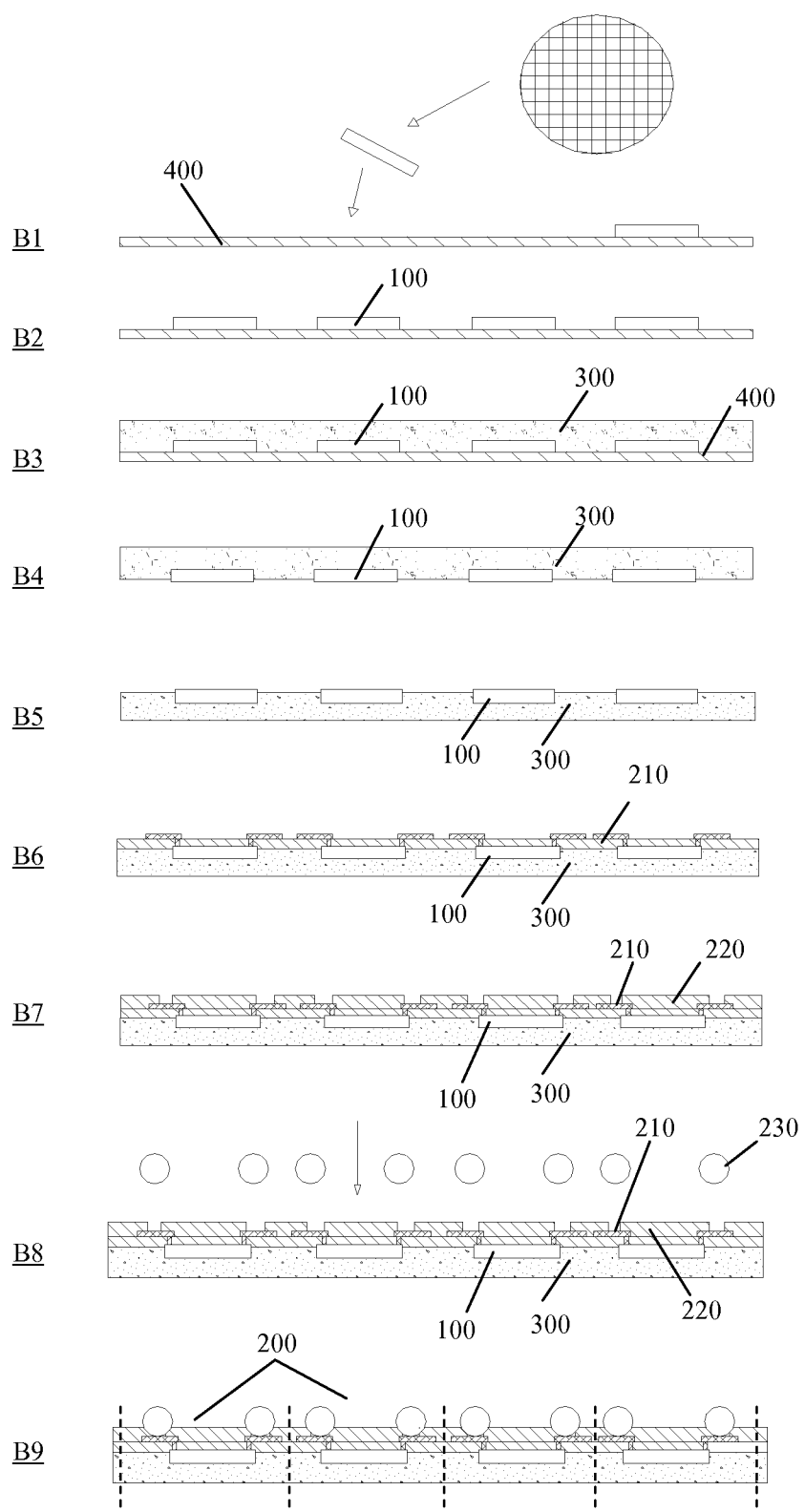
FIG. 4 is schematic diagram of production process of the semiconductor chip package as shown in FIG. 3.
Figure 5:
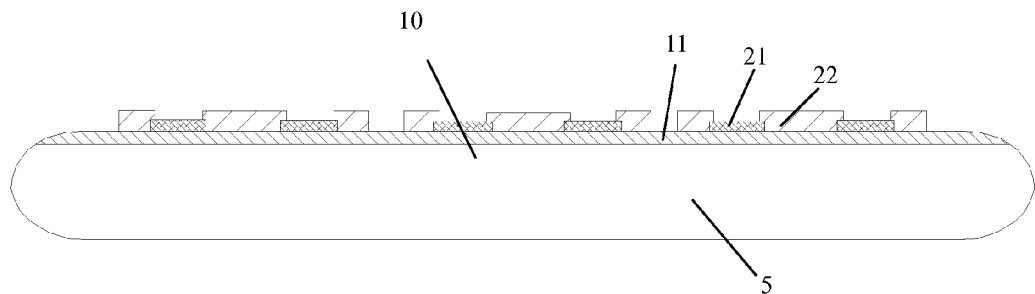
FIGS. 5-14 are the flow diagrams of the wafer level packaging method for encapsulating both the bottom and side of the semiconductor chip of the present invention.

As shown in FIG. 5, the process starts with a wafer 5 including a plurality of semiconductor chips 10 formed at the front surface of the wafer 5 with the front side process for the semiconductor chips completed, in which an initial layer 11, for example a silicon oxide layer, is formed on top of the front side of the semiconductor wafer 5 and metal contact pads 21, for example aluminum pads, are formed on the initial layer 11 and electrical isolated by passivation layer 22. When the semiconductor chip package is a power device, the metal contact pads 21 can be re-distributed metal pads. Patterns for chip packages 20, shown in FIG. 14, correspondingly are made on front side of the semiconductor chips 10.

Figure 6:
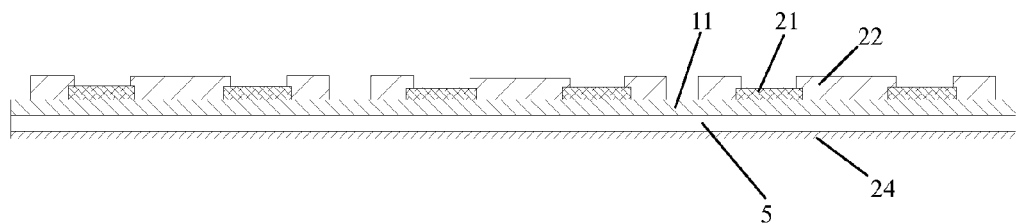

As shown in FIG. 6, the back side of the wafer 5, thus semiconductor chips 10, is ground to reduce its thickness followed by backside etch and backside metallization to form metal layer 24 of a certain thickness on the backside of the semiconductor chips 10.

Figure 7:
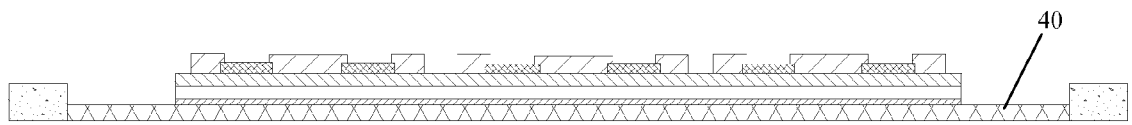

As shown in FIG. 7, the backside of the wafer 5 is mounted on a UV tape 40 functioning as a dicing film, such that metal layer 24 on the backside of the semiconductor chip 10 being fixed on the dicing film 40.

Figure 8:
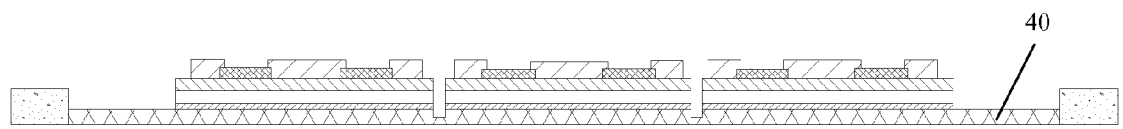

As shown in FIG. 8, individual semiconductor chips 10 are separated by cutting from the front side but are still connected on the dicing film 40 to keep the relative positions and space between the semiconductor chips 10, thus maintaining the wafer shape.

Figure 9:
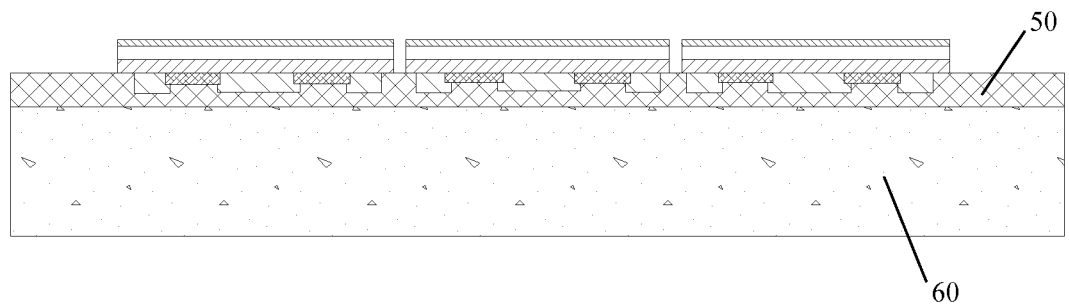

As shown in FIG. 9, the whole structure of the semiconductor wafer 5 with dicing film 40 shown in FIG. 8 is flipped and attached on top surface of an adhesive tape 50, then the dicing film 40 is removed. The adhesive tape 50 covers the surface and the sides of metal contact pads 21, passivation layer 22 on front side of the semiconductor chip 10 and is connected with the front side of the initial layer 11.

In one embodiment, the adhesive tape 50 is a double-sided tape with its bottom side attached on a supporting plate 60 that may be a glass substrate or other semiconductor wafer. The double-sided tape 50 may be a thermal release tape or an UV release tape. The separated semiconductor chips are attached on top surface of the double-sided tape 50, thus relative positions and space between the semiconductor chips 10 are remained.

In another embodiment, the tape 50 has a relatively good ductility, so that the tape 50 may be stretched after the dicing tape is removed to enlarge the space between semiconductor chip packages 20 to facilitate the follow-up filling of plastic material into the space between the adjacent semiconductor chips 10. This can be done by mounting the tape 50 on an expandable fixture. After that the stretched tape may be adhered onto the supporting plate 60 or other fixtures to keep the space between the semiconductor chips 10.

Figure 10:
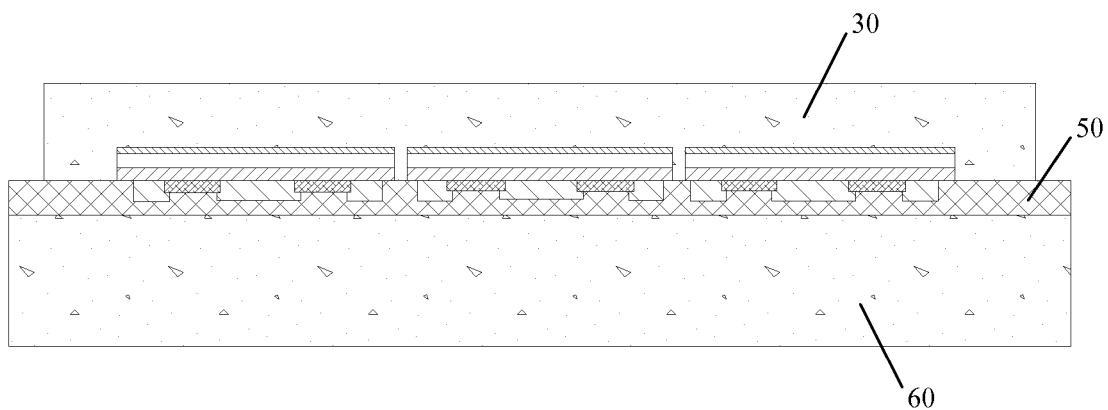

As shown in FIG. 10, a molding compound 30 is deposited to cover with a sufficient thickness on top of the double-sided tape, and to fill in the space between adjacent semiconductor chips 10 and cover the metal layers 24 on the back side of the semiconductor chip 10. The molding compound 30 thus encapsulates the backside (that is the bottom side of the finished product) and the side walls of each semiconductor chip 10.

Figure 11:
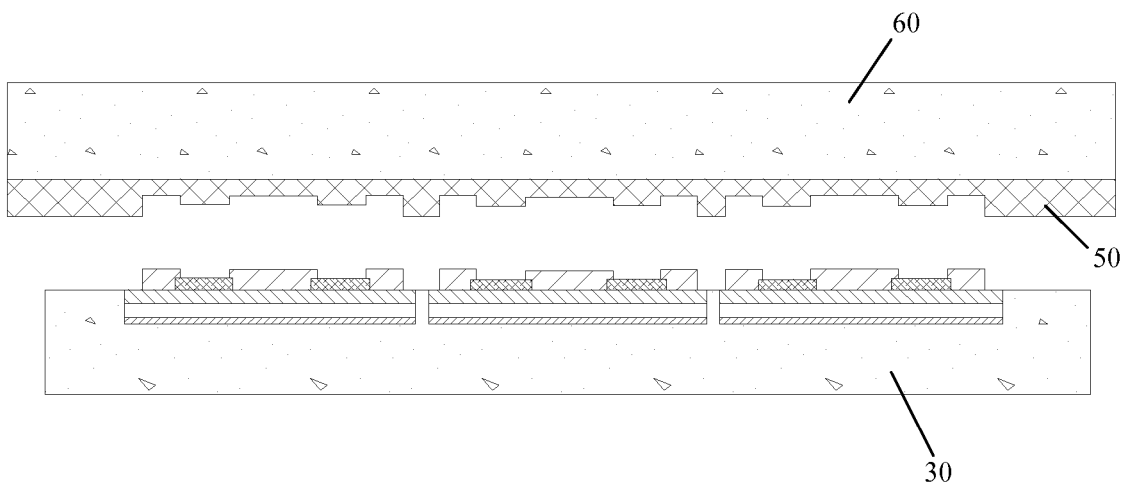
Figure 12:
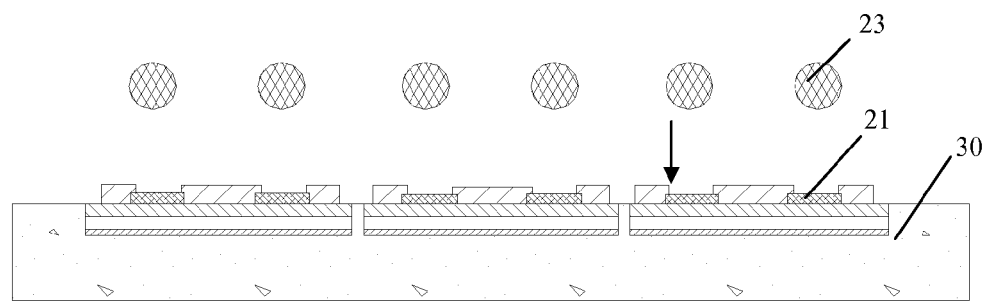
Figure 13:
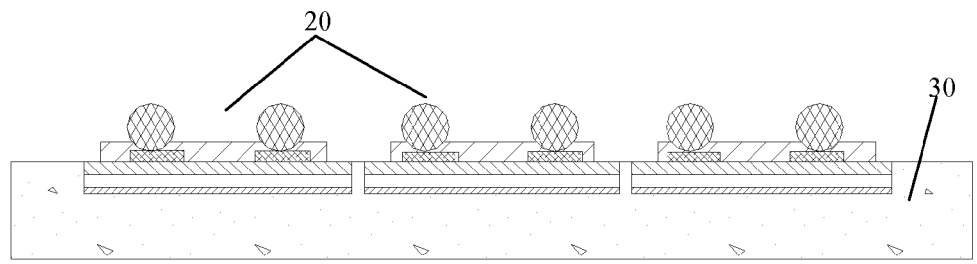

As shown in FIG. 11, the whole structure of FIG. 10 is flipped and the supporting plate 60 and the double-sided tape 50 are removed. At this point, the chip packages 20 are held together by the molding compound 30. As shown in FIG. 12 and FIG. 13, solder balls 23, such as tin balls, are placed at positions corresponding to the top electrodes of each semiconductor chip 10 on top of the metal contact pads 21 on the front side of semiconductor chip 10. The solder balls 23 are thus subjected to a reflow process.

Figure 14:
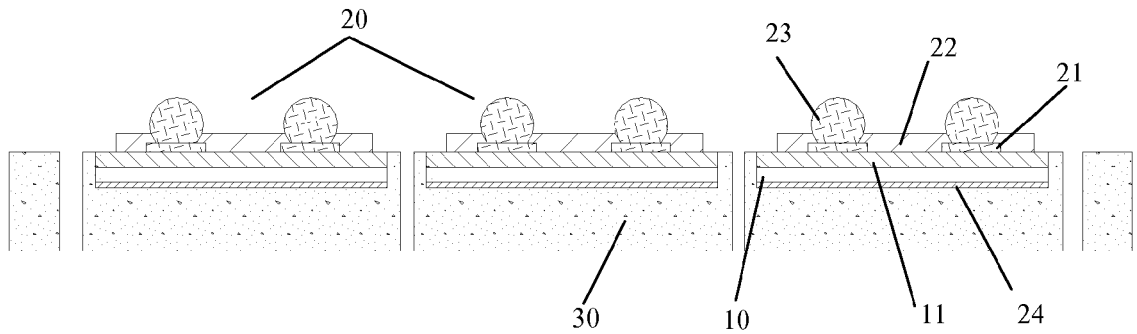

As shown in FIG. 14, individual semiconductor chip packages 20 are separated by cutting through the plastic body 30 in the space between adjacent semiconductor chip packages 20, as such the side of each semiconductor chip package 20 is encapsulated with a certain amount of plastic body 30 for protection. Thus, both side walls and bottom of each chip package 20 is encapsulated with plastic body 30 for protection.

Although the contents of this invention have been described in detail in the above said preferred embodiments, it should be recognized that the above description shall not be considered as a limitation to this invention. After reading the above description by technical personnel in this field, a number of modifications and replacements for this invention will be obvious. Therefore, the scope of protection for this invention shall be in accordance with the attached claims.

The invention claimed is:

1. A wafer level chip scale packaging method for encapsulating a bottom and side walls of a semiconductor chip comprising:
   preparing a plurality of semiconductor chips at a front side of a semiconductor wafer;
   grinding at a backside to reduce a thickness of the semiconductor wafer;
   attaching the backside of the semiconductor wafer onto a dicing film;
   cutting from the front side of the semiconductor wafer to separate the semiconductor chips, each semiconductor chip remaining its position on the dicing film with the relative position and space between adjacent semiconductor chips unchanged;
   flipping and attaching the semiconductor chips remaining on the dicing film on a top surface of a double-sided tape, removing the dicing film, and attaching a bottom surface of the double-sided tape on a supporting substrate;
   depositing a molding compound to cover the back side of the semiconductor chips and to fill in the spaces between the adjacent semiconductor chips;

flipping the semiconductor chips with the molding compound, removing the supporting substrate and the double-sided tape from the front side of semiconductor chips;

depositing and reflow solder balls on the front side of the semiconductor chips at positions corresponding to top electrodes of each semiconductor chip; and cutting through the molding compound in the space between adjacent chips to separate individual chip packages, the bottom and side walls of each semiconductor chip are covered with the molding compound for protection.

2. The wafer level chip scale packaging method of claim 1, wherein the semiconductor chip is a MOSFET including an initial layer of silicon dioxide, metal contact pads of aluminum and a passivation layer.

3. The wafer level chip scale packaging method of claim 2, further comprising, after grinding at a backside to reduce the thickness of the semiconductor wafer, forming a metal layer with a certain thickness on the backside of the semiconductor wafer.

4. The wafer level chip scale packaging method of claim 1, wherein the semiconductor chip package is a power device including an initial layer of silicon dioxide, re-distributed metal contact pads of aluminum, and a passivation layer formed on the front side of the chip package.

5. The wafer level chip scale packaging method of claim 1, wherein the double-sided tape is stretched to enlarge the space between adjacent semiconductor chips for depositing the molding compound into the space.

6. The wafer level chip scale packaging method of claim 5, wherein the dicing film is a UV tape and the double-sided tape is a thermal release tape or UV release tape.

7. The wafer level chip scale packaging method of claim 5, wherein the supporting substrate is a glass substrate or other semiconductor substrate.

\* \* \* \* \*